US006534872B1

(12) United States Patent
Freda et al.

(10) Patent No.: US 6,534,872 B1
(45) Date of Patent: Mar. 18, 2003

(54) APPARATUS AND SYSTEM WITH INCREASED SIGNAL TRACE ROUTING OPTIONS IN PRINTED WIRING BOARDS AND INTEGRATED CIRCUIT PACKAGING

(75) Inventors: Michael C. Freda, Morgan Hill, CA (US); Han Y. Ko, San Jose, CA (US); Ali Hassanzadeh, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/371,722

(22) Filed: Aug. 10, 1999

Related U.S. Application Data

(63) Continuation of application No. 09/170,380, filed on Oct. 13, 1998, now abandoned.

(51) Int. Cl.[7] .................................................. H01L 29/40
(52) U.S. Cl. ....................................... 257/774; 257/786
(58) Field of Search ................................ 257/774, 786, 257/775, 776

(56) References Cited

U.S. PATENT DOCUMENTS

| 5,477,082 A | 12/1995 | Buckley, III et al. |
| 5,516,030 A | 5/1996 | Denton |
| 5,585,675 A | * 12/1996 | Knopf ........................ 257/774 |

(List continued on next page.)

FOREIGN PATENT DOCUMENTS

| EP | 0 378 016 | 7/1990 |
| EP | 0 581 712 | 2/1994 |
| EP | 0 715 355 | 6/1996 |
| EP | 0 823 833 | 2/1998 |
| EP | 0 883 173 | 12/1998 |
| WO | 98/11605 | 3/1998 |

OTHER PUBLICATIONS

JEDEC Design Standard, "Design Requirements for Outlines of Solid State and Related Products," JEDEC Standard No. 95–1, Section 14, Ball Grid Array Package, (55 pages).
JEDEC Design Standard, "Design Requirements for Outlines of Solid State and Related Products," JEDEC Standard No. 95–1, Section 5, Fine Pitch Ball Grid Array Package (FBGA) (Square Outlines), Nov. 1998, Revision #A, (19 pages).

(List continued on next page.)

*Primary Examiner*—Roy Potter
(74) *Attorney, Agent, or Firm*—Meyertons, Hood, Kivlin, Kowert & Goetzel, P.C.; B. Noël Kivlin

(57) ABSTRACT

An apparatus and system comprising electrical interconnection devices (EIDs), such as printed wiring boards, semiconductor packages, and printed circuit boards, having novel via and signal trace positioning. The vias may be positioned off-center from the pattern of the surface pads. Via groups, or staircase vias, connect surface pads with vias extending into the electrical interconnection device. The via groups convert the pad geometry on the surface to a more open via pattern on one or more internal layers. The EID comprises a plurality of pads formed on a surface for providing electrical connections to another EID. A plurality of vias each extend from a corresponding pad to another layer of the printed wiring board. Each via is offset from a central location of its corresponding pad. A via group comprises a plurality of vias with a first via connecting a surface of the electrical interconnection device to a first inner layer electrically connects a pad on a surface of the electrical interconnection device to a second via. The second via extends from the first inner layer to a second layer of the electrical interconnection device. The centers of the first via and the second via are non-collinear. Another EID includes a uniformly spaced set of pads on the surface. Via groups, comprising a first set of vias and a second set of vias, extend from the uniformly spaced surface pads. Spacing among the second set of vias is non-uniform.

31 Claims, 16 Drawing Sheets

U.S. PATENT DOCUMENTS

| | | | |
|---|---|---|---|
| 5,706,178 A | | 1/1998 | Barrow |
| 5,780,143 A | | 7/1998 | Shimamoto et al. |
| 5,784,262 A | * | 7/1998 | Sherman ..................... 361/777 |
| 5,847,936 A | | 12/1998 | Forehand et al. |

OTHER PUBLICATIONS

JEDEC Design Standard, "Design Requirements for Outlines of Solid State and Related Products," JEDEC Standard No. 95–1, Section 10, Generic Matrix Tray For Handling and Shipping, Nov. 1997, Revision #C, (10 pages).

The Institute for Interconnecting and Packaging Electronic Circuits, "Surface Mount Design and Land Pattern Standard," IPC–SM 782, Revision A—Aug. 1993 Includes Amendment Oct. 1, 1996, (192 pages).

Patent Abstracts of Japan, Pub. No. 02056996, Pub. Date: Feb. 26, 1990.

Patent Abstracts of Japan, Pub. No. 05082964, Pub. Date: Apr. 2, 1993.

Patent Abstracts of Japan, Pub. No. 08288658, Pub. Date: Nov. 1, 1996.

International Search Report, Application No. PCT/US99/23942, mailed Feb. 11, 2000.

JEDEC Design Standard, "Design Requirements for Outlines of Solid State and Related Products," JEDEC Standard No. 95–1, Section 14, Ball Grid Array Package, (55 pages).

JEDEC Design Standard, "Design Requirements for Outlines of Solid State and Related Products," JEDEC Standard No. 95–1, Section 5, Fine Pitch Ball Grid Array Package (FBGA) (Square Outlines), Nov. 1998, Revision # A, (19 pages).

JEDEC Design Standard, "Design Requirements for Outlines of Solid State and Related Products," JEDEC Standard No. 95–1, Section 10, Generic Matrix Tray For Handling and Shipping, Nov. 1997, Revision # C, (10 pages).

The Institute for Interconnecting and Packaging Electronic Circuits, "Surface Mount Design and Land Pattern Standard," IPC–SM 782, Revision A –Aug. 1993 Includes Amendment 1 Oct. 1996, (192 pages).

Patent Abstracts of Japan, Pub. No. 02056996, Pub. Date: Feb. 26, 1990.

Patent Abstracts of Japan, Pub. No. 05082964, Pub. Date: Apr. 2, 1993.

Patent Abstracts of Japan, Pub. No. 08288658, Pub. Date: Nov. 1, 1996.

International Search Report, Application No. PCT/USpp/23942, mailed Feb. 11, 2000.

* cited by examiner

APPARATUS AND SYSTEM WITH INCREASED SIGNAL TRACE ROUTING OPTIONS IN PRINTED WIRING BOARDS AND INTEGRATED CIRCUIT PACKAGING

This application is a continuation of application Ser. No. 09/170,380, filed Oct. 13, 1998, now abandoned.

BACKGROUND OF THE INVENTION

1. Field of the Invention

This invention relates to device packaging and printed wiring boards, in general, and, more particularly, to placement of vias and signal traces for signal routing.

2. Description of the Related Art

Printed wiring boards are often built of several layers joined together, often by lamination. The surface or top layer usually has surface pads for connecting integrated circuits such as computer chips, memories, etc. These surface pads are usually placed in a pattern that matches the connectors on an integrated circuit to be mounted on the printed wiring board. The surface pads are most often placed in arrays, as will be seen below with respect to FIGS. 2A and 2B.

To make connections between various components mounted on the printed wiring board, signal traces link the surface pads with power, ground, etc. As there are often more signal traces than can be reasonably manufactured on only the surface layers, vias are used to connect signal traces placed on various internal layers to the surface layers. To lower infrastructure costs by following industry standard practices, the vias are usually placed in the same uniform array pattern as the surface pads, with rows and columns of vias. The vias connect to the surface pads on the surface layer and are additionally connected as needed to various signal traces on the other layers.

As the number of layers increases, the cost of manufacturing the printed wiring board increases. To decrease the number of layers used, the number of signal traces between the vias may be increased, that is, instead of a single signal trace between each pair of rows or columns, two or more signal traces are placed. Since the vias normally comprise a uniform array with pitch spacing set by agreement or industry standards to correspond to the surface pads, placing two signal traces instead of one signal trace requires that the two signal traces be thinner, i.e. have a smaller width. A signal line must have a certain minimum width for the signal trace to be manufacturable with a high degree of reliability. The thinner the signal trace, the more expensive the signal trace is to manufacture. So building printed wiring boards with more layers may prove less expensive, in some instances, than building fewer layers with thinner signal traces.

Integrated circuit packaging may now include technology originally designed for printed wiring boards. For example, some integrated circuits include what is, in essence, a miniature printed wiring board between the semiconductor itself and the plastic or ceramic packaging, which encases and protects the semiconductor. This miniature printed wiring board converts the signal outputs of the semiconductor to the connector pinout that corresponds to the printed wiring board pads. What is needed is a way to build electrical interconnection devices, such as semiconductor packages and printed wiring boards, less expensively while providing sufficient signal traces.

SUMMARY OF THE INVENTION

The problems outlined above are in large part solved by an apparatus and system comprising electrical interconnection devices, such as printed wiring boards, semiconductor packages, and printed circuit boards, having novel via and signal trace positioning. In one embodiment, the vias are repositioned off-center from the pattern of the surface pads, while the surface pads remain in their desired pattern. This embodiment may advantageously increase signal trace routing density. In another embodiment, via groups, also referred to as staircase vias, connect surface pads with vias extending into the electrical interconnection device. The via groups preferably convert the pad geometry on the surface to a more open via pattern on one or more internal layers. These embodiments may advantageously increase signal trace routing density, which may allow for the electrical interconnection device to have fewer layers, yet still maintain ease and cost of manufacturability.

A first embodiment includes a printed wiring board upon which a semiconductor package is to be mounted. The printed wiring board comprises a plurality of pads formed on a surface of the printed wiring board for providing electrical connections to the semiconductor package and a plurality of vias each extending from a corresponding pad to another layer of the printed wiring board. A related embodiment includes a semiconductor package for mounting upon a printed wiring board. The semiconductor package comprises a plurality of pads formed on a surface of the semiconductor package for providing electrical connections to the printed wiring board and a plurality of vias each extending from a corresponding pad to another layer of the semiconductor package. In both embodiments, each of the plurality of vias is offset from a central location of its corresponding pad. This feature may advantageously allow for greater spacing between various vias, allowing more signal traces to be placed therebetween. Additional related embodiments include a printed circuit board comprising a printed wiring board with an integrated circuit attached. Either or both of the printed wiring board and integrated circuit include a via offset from a central location of its corresponding pad.

A further embodiment is contemplated that includes a via group comprising a plurality of vias. In one implementation, a first via connecting a surface of the electrical interconnection device to a first inner layer electrically connects a pad on a surface of the electrical interconnection device to a second via. The second via extends from the first inner layer to a second layer of the electrical interconnection device. The centers of the first via and the second via are non-collinear. This feature may advantageously allow for inner layers of the electrical interconnection device to have additional space for placing additional signal traces. In a related embodiment, an electrical interconnection device includes a uniformly spaced set of pads on the surface. Via groups, comprising a first set of vias and a second set of vias, extend from the uniformly spaced surface pads. Spacing among the second set of vias is non-uniform. This feature may also advantageously allow for inner layers of the electrical interconnection device to have additional space between vias for placing additional signal traces.

BRIEF DESCRIPTION OF THE DRAWINGS

Other objects and advantages of the invention will become apparent upon reading the following detailed description and upon reference to the accompanying drawings in which.

Figure 1A:
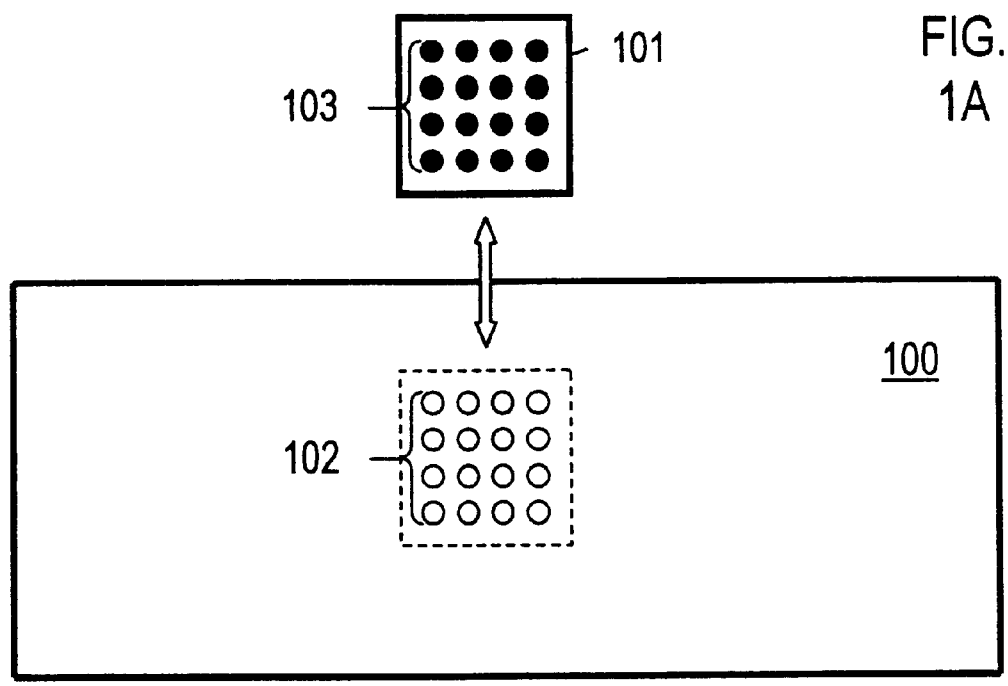
FIG. 1A is a block diagram illustrating a top view of an embodiment of a printed wiring board configured to receive an integrated circuit and a bottom view of an embodiment of the integrated circuit configured to be mounted on the printed wiring board.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

For the purposes of this disclosure, the term "electrical interconnection device" may used to generically describe a printed wiring board, a printed circuit board, an integrated circuit package, a semiconductor device connector, or other mounting structures usable to provide stability to connections to an electrical or electronic device. The terms "printed circuit board" and "printed wiring board" shall be distinguished through the placement or lack thereof of one or more electrical or electronic devices on the surface of the respective board. The term "integrated circuit" shall mean a device, designed to be attached to a printed wiring board, that includes a "semiconductor device" (also referred to as a "semiconductor") and a "semiconductor package" (also referred to as a "package" or an "integrated circuit package"), which protects the semiconductor device and provides means for electrically attaching the semiconductor device to the printed wiring board. It is noted that the integrated circuit and the package of the integrated circuit are both referred to with reference number 101.

FIG. 1A—Printed Wiring Board and Integrated Circuit

Turning to the figures, FIG. 1A shows a block diagram illustrating a top view of an embodiment of a printed wiring board 100 configured to receive an integrated circuit 101 and a bottom view of an embodiment of the integrated circuit 101 configured to be mounted on the printed wiring board 100. As shown, the printed wiring board 100 includes pads 102, while the package of the integrated circuit 101 includes connectors 103. The pads 102 and the connectors 103 are arranged such that each one of the pads 102 aligns with a corresponding one of the connectors 103. It is contemplated that any type or arrangement of pads and connectors may be used. The method of manufacture of the electrical interconnection devices described herein is preferably lamination, although other methods, such as ceramic and semiconductor processing techniques, are also contemplated.

Figure 1B:
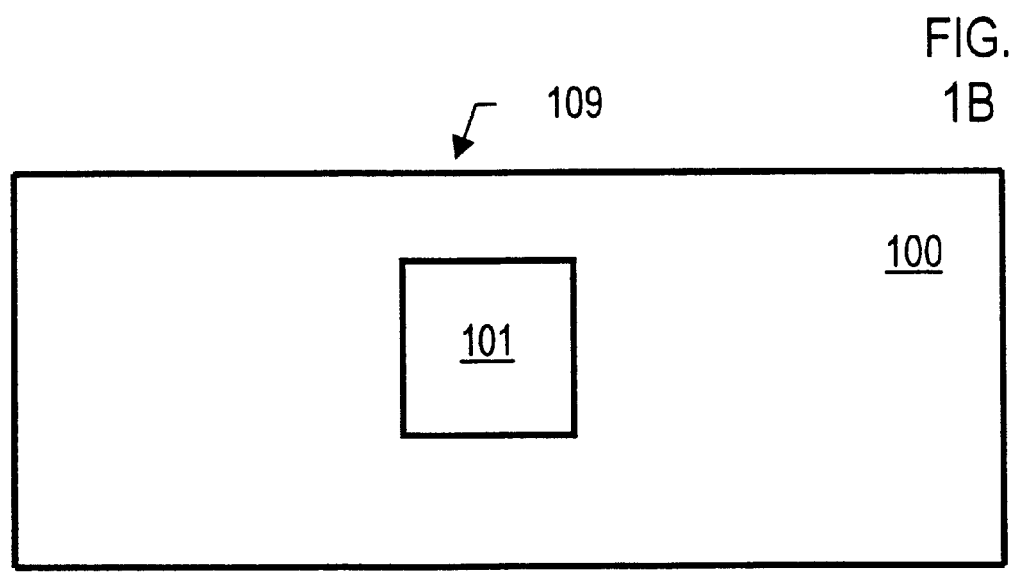
FIG. 1B is a block diagram of a top view of an embodiment of a printed circuit board comprising the integrated circuit of FIG. 1A mounted on the printed wiring board of FIG. 1A.
Figure 1C:
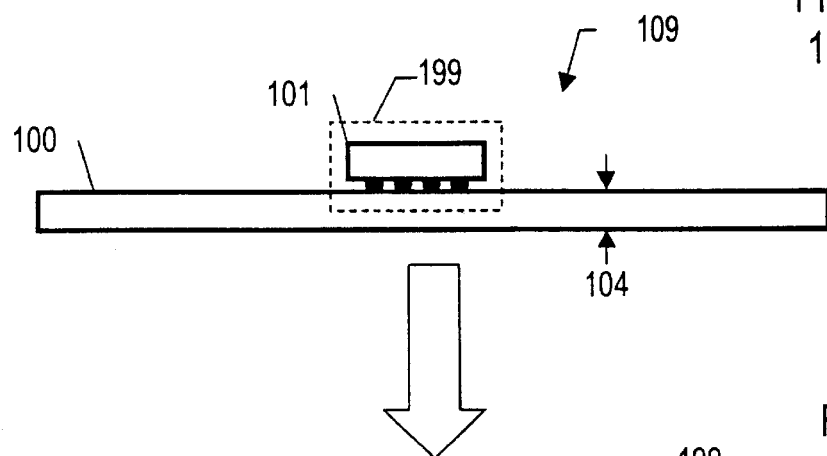
FIG. 1C is a block diagram of a side view of the printed circuit board of FIG. 1B.

FIGS. 1B and 1C—Printed Circuit Board

FIG. 1B is a block diagram of a top view of an embodiment of a printed circuit board 109 comprising an integrated circuit 101 mounted on a printed wiring board 100. FIG. 1C illustrates a side view of the printed circuit board 109 of FIG. 1B. The printed wiring board 100 is shown to include a width 104, preferably comprising a plurality of layers. The layers may include, in various embodiments, top and bottom surface layers and one or more internal layers. One embodiment of highlighted area 199 is shown in detail in FIG. 1D. The preferred means of mounting the integrated circuit 101 on the printed wiring board 100 is soldering using solder balls. It is noted that other mounting methods may be used, as is well known in the art.

Figure 1D:
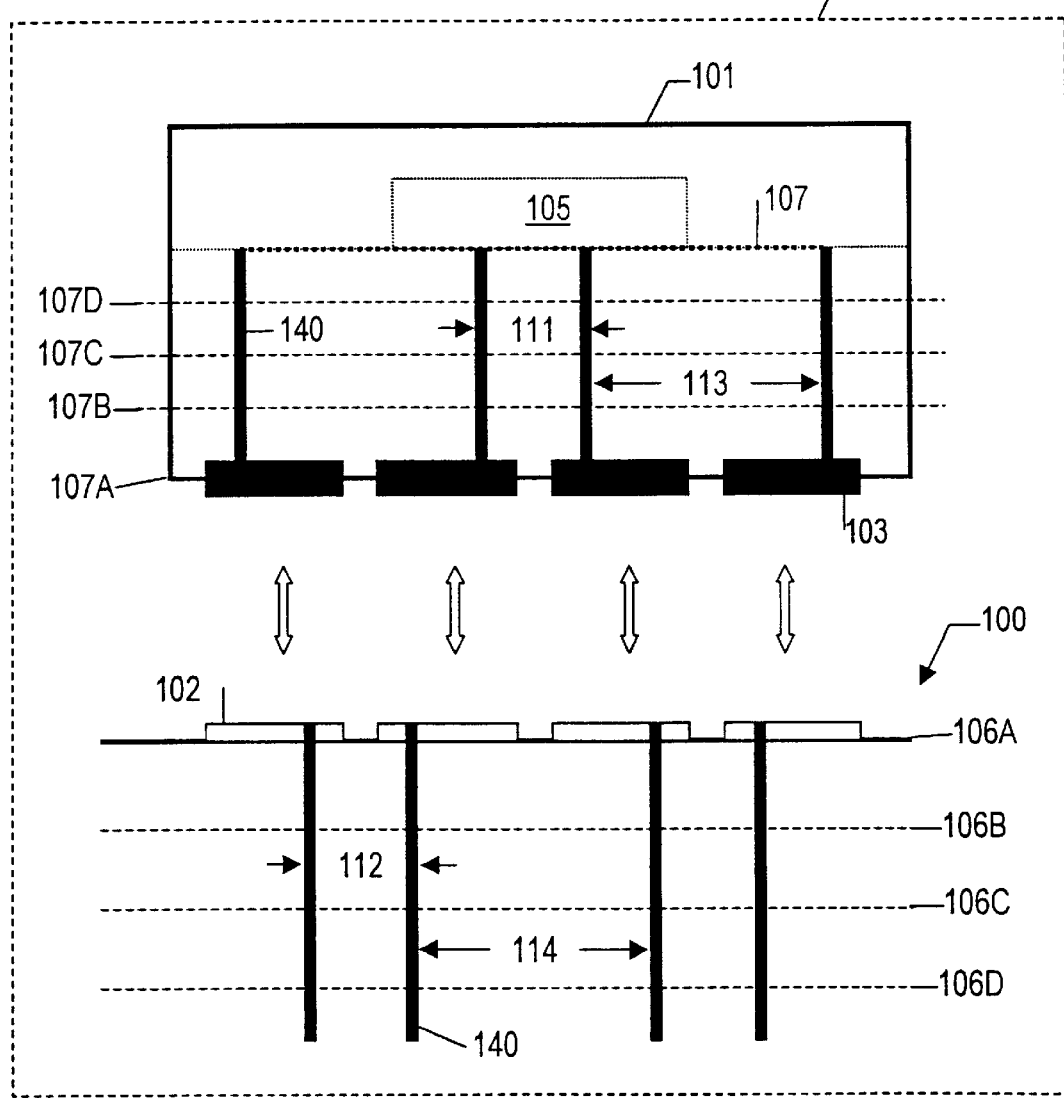
FIG. 1D is a block diagram of a close-up, cut-away view of the highlighted area of FIG. 1C illustrating the connections between the integrated circuit and the printed wiring board as well as an embodiment of the via locations of both the integrated circuit and the printed wiring board.

FIG. 1D—Close-Up, Cut-Away View of Printed Circuit Board

FIG. 1D is a block diagram of a close-up, cut-away view of an embodiment of the highlighted area 199 of FIG. 1C. As shown, FIG. 1D illustrates the connections between the integrated circuit 101 and the printed wiring board 100 as well as an embodiment of the via 140 locations of both the integrated circuit 101 and the printed wiring board 100. It is contemplated that the angle between the pads 102/103 and vias 140 may differ in other embodiments from the 90 degrees shown in FIG. 1D.

As illustrated, integrated circuit 101 includes a packaged semiconductor 105. The semiconductor 105 is connected to the package through interconnects 107. Interconnects 107 may be wiring bonding, flexible circuits, or other interconnects as are well known in the art. The interconnects 107 electrically couple the semiconductor 105 through the vias 140 to the connectors (or pads) 103 on a surface 107A of the integrated circuit 101. In the embodiment of integrated circuit 101 shown, the vias 140 extend substantially orthogonally into the integrated circuit 101 from locations offset from a central location of each corresponding connector 103. Spacing 111 between closer pairs of vias 140 is smaller than spacing 113 between more distant pairs of vias. The connectors 103 are preferably arranged in a uniformly spaced array. It is noted that the integrated circuit 101 includes a plurality of internal layers, 107B, 107C, and 107D. In other implementations, there may be more or fewer layers than as shown.

A portion of the printed wiring board 100 is also shown in FIG. 1D. As illustrated, the printed wiring board 100 includes a preferably uniformly spaced array of pads 102 on the surface 106A of the printed wiring board 100. It is noted that the connectors 103 of the integrated circuit 101 and the pads 102 of the printed wiring board 100 align, allowing the integrated circuit 101 to be mounted on the printed wiring board 100. A plurality of vias extends substantially orthogonally from the pads 103 from a location offset from a central location of each corresponding pad 102. Spacing 112 between closer pairs of vias 140 is smaller than spacing 114 between more distant pairs of vias. It is noted that the printed wiring board 100 includes a plurality of internal layers, 106B, 106C, and 106D. In other embodiments, there may be more or fewer layers than as shown.

Figure 2A:
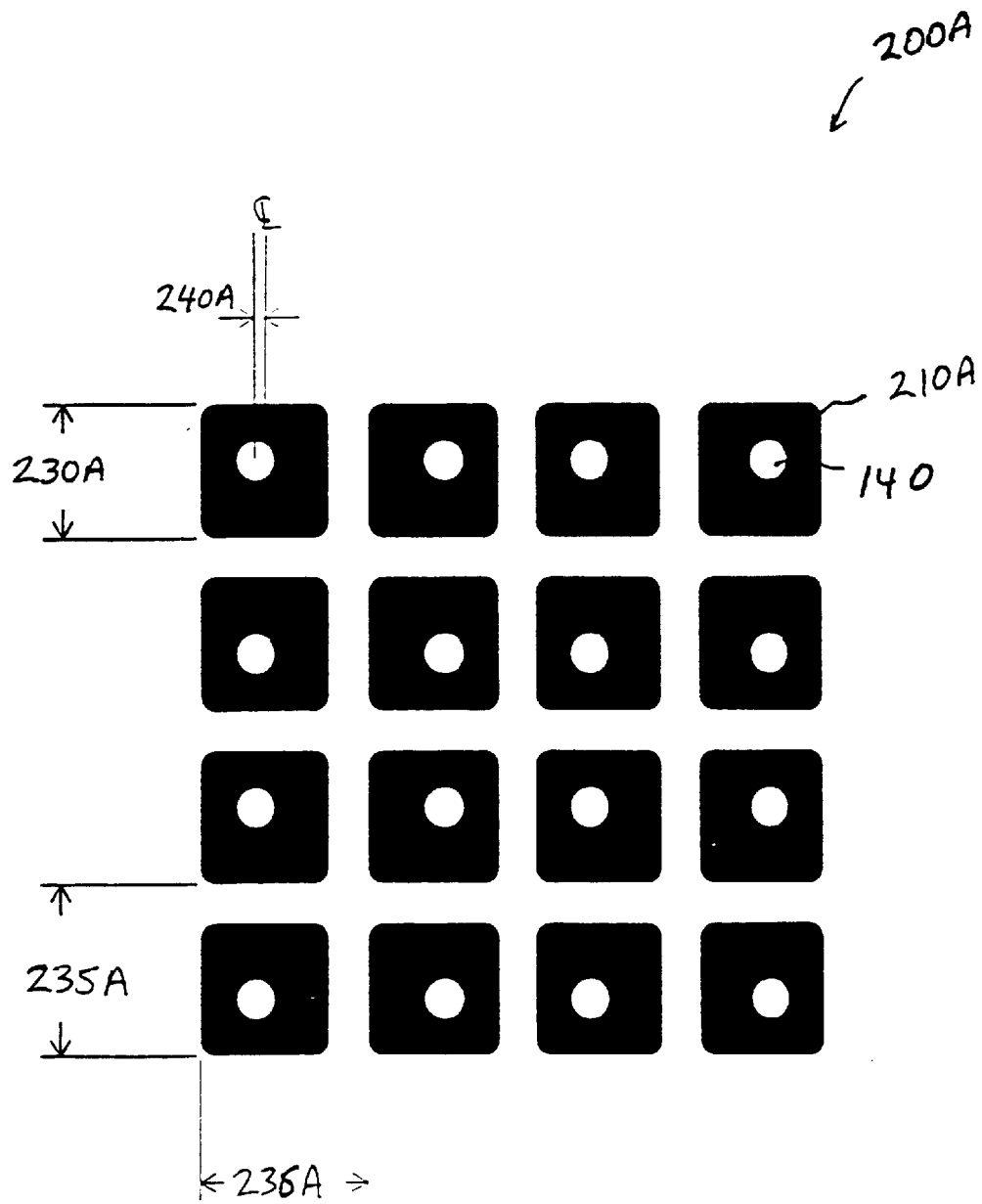
FIGS. 2A and 2B show embodiments of surface pads of the printed wiring board and respective locations where the vias may intersect the surface pads.
Figure 2B:
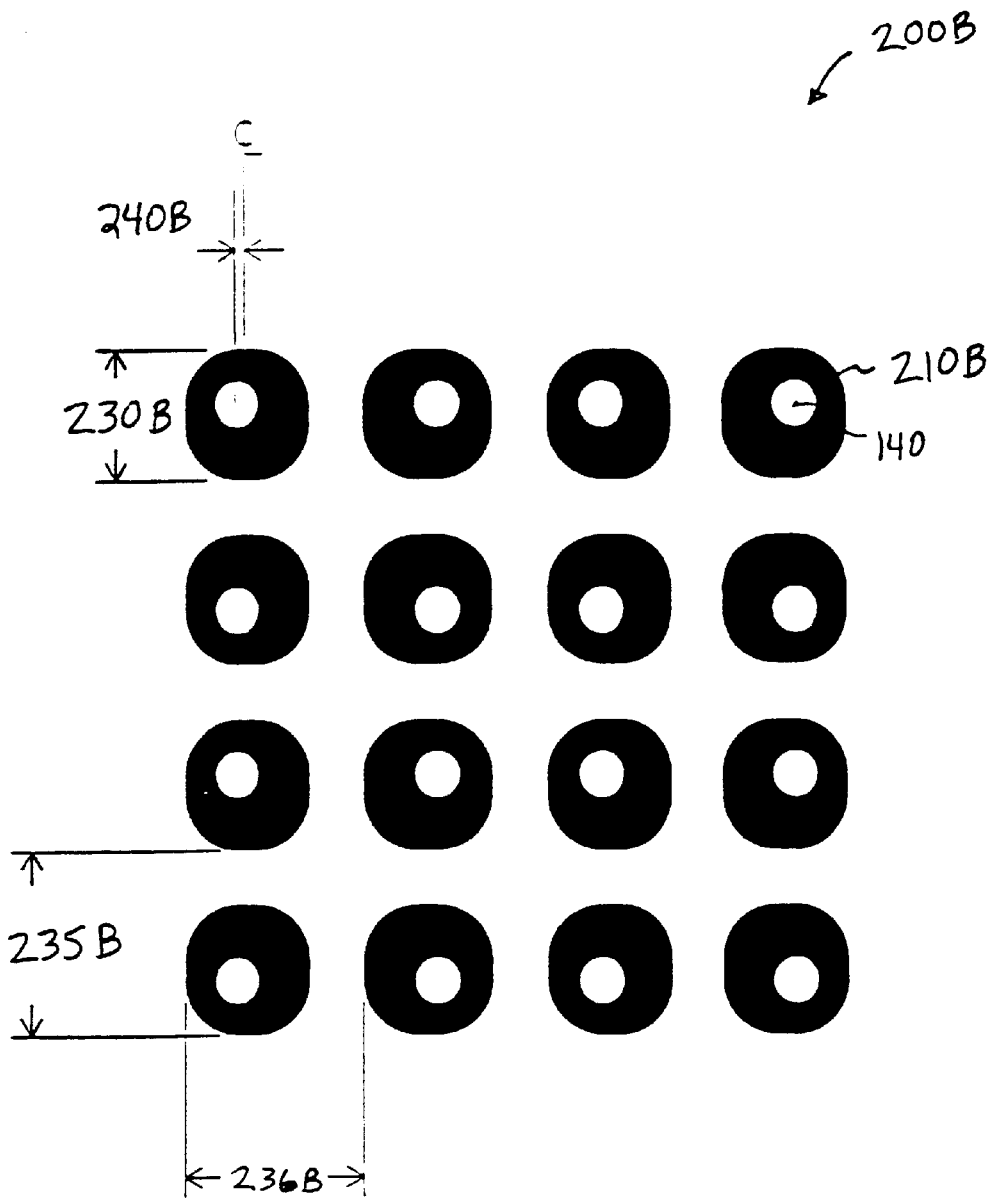

FIGS. 2A and 2B—Surface Pads

Embodiments 200A and 200B of land grid array (LGA) surface pads and connections to vias 140 offset from the centers of the pads 210A/210B are shown in FIGS. 2A and 2B. A uniform array 200A of LGA surface pads 210A is shown in FIG. 2A. The pads 210A are substantially square in shape with rounded corners. Each surface pad 210A has dimensions 230A with inter-pad row spacing 235A and column spacing 236A. The vias 140 are offset from the centerline of the of LGA surface pads 210A by distance 240A. Note that the direction of the offset distance 240A alternates from column to column and row to row. Although the offset distance is shown to change in a uniform way, other patterns of change are contemplated from row to row and column to column, both separately and together. Referring to the other figures may identify further aspects of FIG. 2A.

Similarly, a uniform array 200B of LGA surface pads 210BA is shown in FIG. 2B. The pads 210B are substantially circular in shape with flattened edges. Each surface pad 210B has dimensions 230B with inter-pad row spacing 235B and column spacing 236B. The vias 140 are offset from the centerline of the of LGA surface pads 210B by distance 240B. Note that the direction of the offset distance 240B alternates from column to column and row to row similarly to 240A. Although the offset distance is shown to change in a uniform way, other patterns of change are contemplated from row to row and column to column, both separately and together. Referring to the other figures may identify further aspects of FIG. 2B.

Although LGA pads 210A/210B are illustrated in FIGS. 2A and 2B, other types of pads or surface connection areas or connectors are contemplated, including various ball grid arrays (BGA), including tape (or tab) BGA, ceramic column grid array (CCGA), or chip scaled packages (CSP). Other arrangements of surface pads (or connections) other than the square array shown are also contemplated. It is noted that surface pads may be used on any of the embodiments of an electrical interconnection device. It is also noted that surface pads may have a physical size as small as the cross-sectional area of the vias to which the surface pads intersect. In effect, a surface pad may comprise nothing more than the top of the via.

Figure 3A:
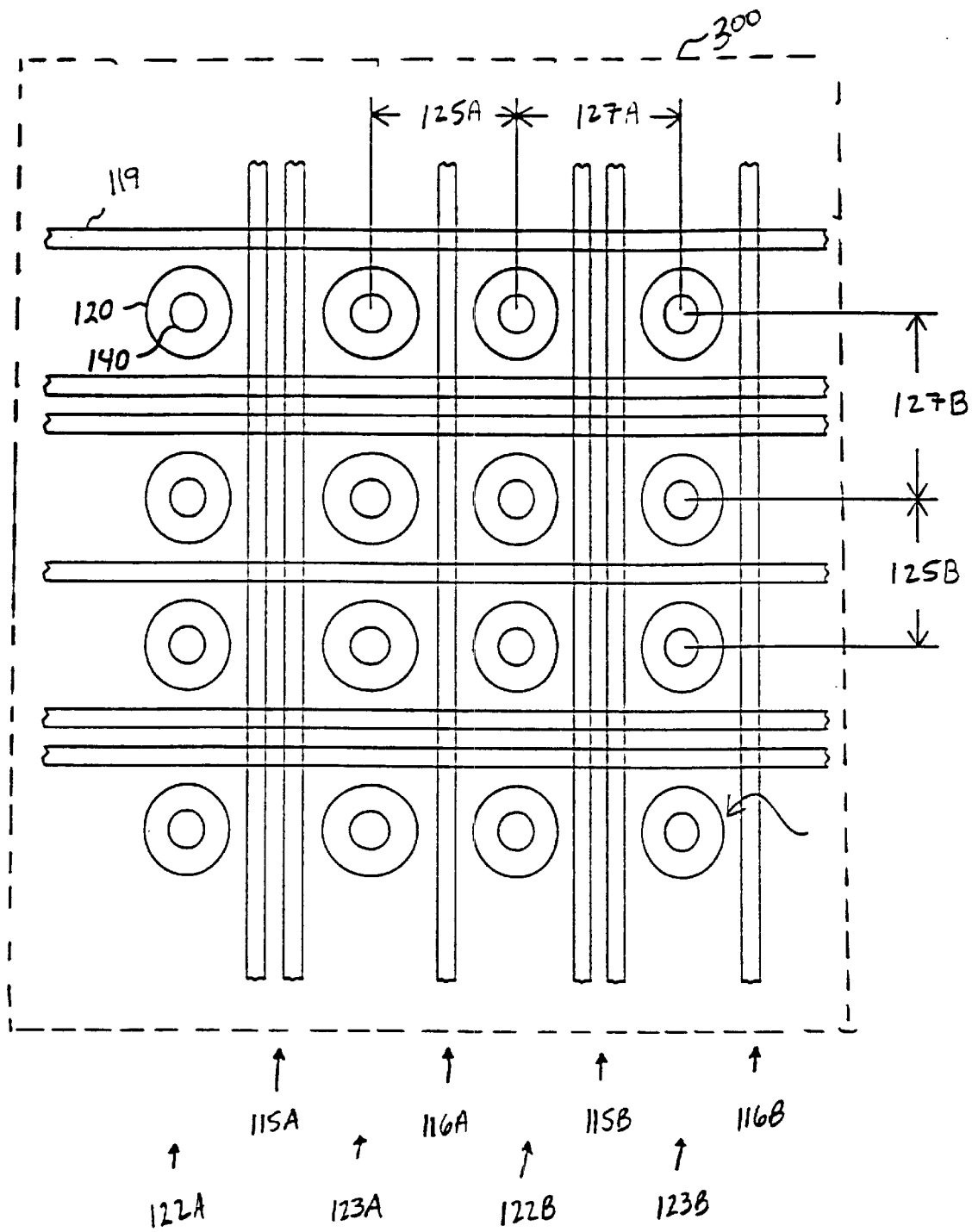
FIGS. 3A and 3B illustrate an embodiment of internal layers of an electrical interconnection device showing respective locations of vias and potential signal traces.
Figure 3B:
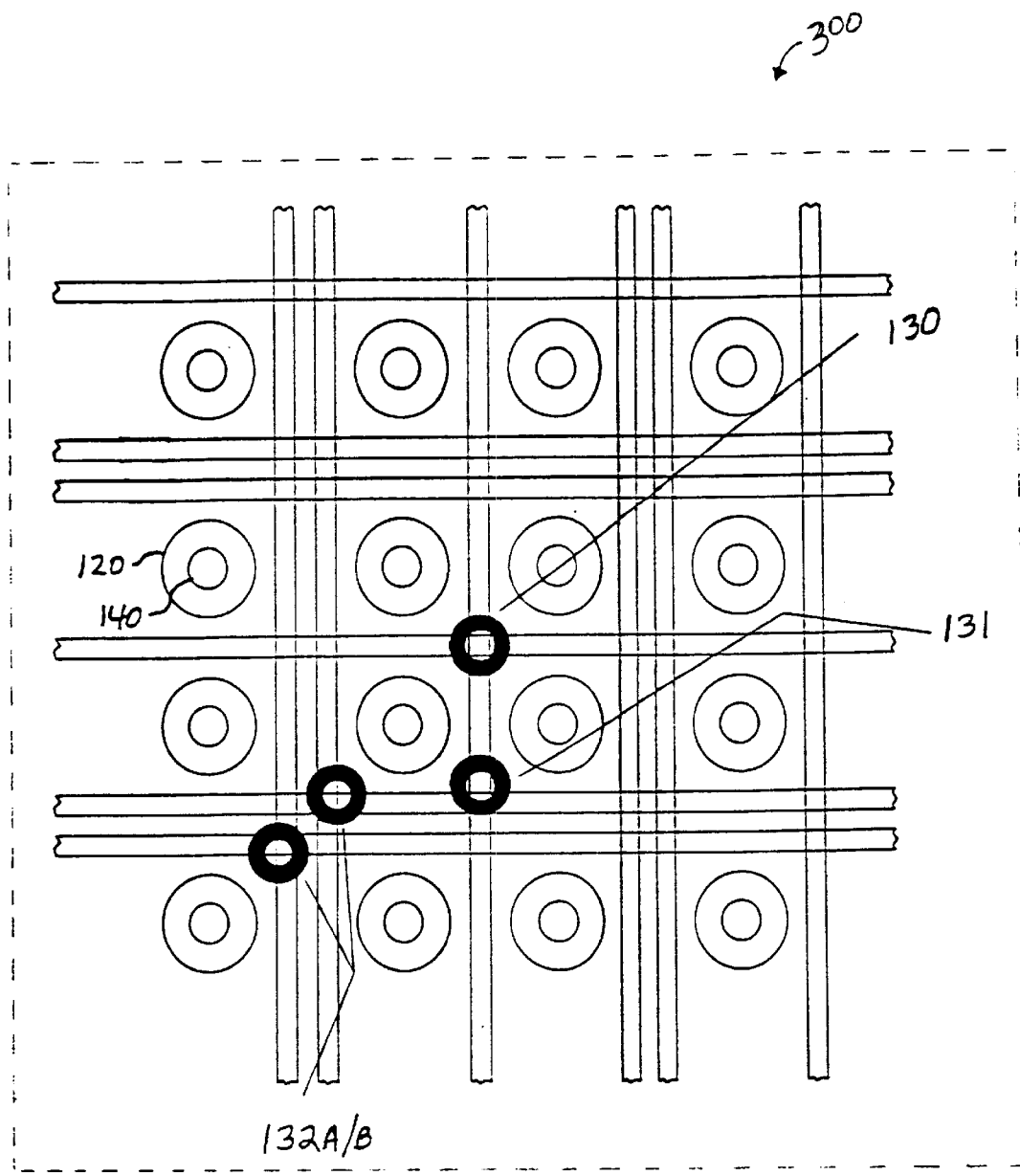

FIGS. 3A and 3B—Electrical Interconnection Device Internal Layers

A diagram of an embodiment of a portion of an internal layer of an electrical interconnection device 300 showing respective locations of via pads 120 and vias 140 and possible locations for signal traces 110 (also referred to as signal traces 110). It is noted that the vias 140 may be centered in the via pads 120 on the internal layers of the electrical interconnection device 300 without regard to where the vias 140 intersect with surface pads on a surface of the electrical interconnection device 300. Each via 140 extends through to one or more additional layers (upwards, out of the page and/or downwards, into the page) of the electrical interconnection device 300. It is noted that vias 140 often have optional via pads 120 on internal layers. Each via pad 120 may readily provide for electrically connecting a signal trace 119 to the respective via 140 to which the via pad 120 connects.

The signal traces 119 shown in FIG. 3A are potential only, as each individual design is limited to some number less than the maximum number of signal traces 119 shown. In this embodiment, the signal traces 119 are grouped in rows and columns 115/116 in alternating groups of twos 115A/B and ones 116A/B. Likewise, the vias 140 (with via pads 120) are placed in rows and columns 122/123 with alternating spacing for the number of signal traces 119 that may be placed therebetween. As shown, neighboring columns of vias 140 having the same letter (AA or BB) have two potential signal traces 115A/B therebetween and spacing 127A, while neighboring columns of vias 140 with differing letters (AB or BA) have one potential signal trace 116 therebetween and spacing 125A. Spacing 125 as shown is less than spacing 127. It is noted that row spacings 125B and 127B may be similar or different from the column spacings 125A and 127A.

In other embodiments, spacing 125 allows for as few as no (zero) signal tracings between the rows and/or columns of pads 120 and as many as desired. Spacing 127 may allow for any number of signal traces greater than or equal to spacing 125. The difference in the number of signal traces inside spacing 125 and spacing 127 will preferably be any non-zero integer number, as desired. The one signal trace 116 and two signal trace 115 example shown is exemplary only, and is referred to as "one-and-one-half tracking".

FIG. 3B is a diagram of the embodiment of FIG. 3A showing additional possible connections between the signal traces 119 on the electrical interconnection device 300. Buried via pads 130–132 are via pads on the illustrated layer 300 of a buried via pair, a buried via that extends from one internal layer to another internal layer with buried via pads at each end. Buried via pairs may advantageously allow for connecting signal traces on different layers without obstructing signal trace routing on other layers, as would occur if a via extended through all layers of the electrical interconnection device 300. Buried via pad 130 connects one X track location and one Y track location on this layer with one X track location and one Y track location on another layer. Buried via pad 131 is shown connecting the same Y track as buried via pad 130 in another location on this layer and a single X track of two possible tracks in another location. Similar tracks on another layer would also be connected. Buried via pads 132A/B show two possible ways to connect a single X track location and a single Y track location at an intersection of two X tracks and two Y tracks. Of the four diagonals available at the intersection of two X tracks and two Y tracks, only two diagonals may be used at one time. Referring to the other figures may identify further aspects of FIG. 3B.

FIGS. 4A–4D—Via Groups

In each of FIGS. 4A–4D, one or more vias electrically connect a surface pad to a core via. In each illustrated embodiment of a via group, a first via extends from a top layer, usually a surface, to a bottom layer, usually an inner layer. The first via makes an electrical connection between the two layers. The first via also electrically connects to a pad on the surface. A second via extends between the bottom layer of the first via to another layer, usually another inner layer. The second via is positioned such that the centers of the first via and the second via are non-collinear, that is, the first via and the second via are separate and do not lie along the same line, but they are electrically connected, usually through a short signal trace.

In various embodiments, the via group may also include a third via. The third via extends from the bottom layer of the second via to another layer and electrically connects to the first and second vias. In one embodiment of the via group, including the third via, the second and third vias are non-collinear. In another embodiment, the first, second, and third vias are all non-collinear. Via groups are preferably positioned internal to an electrical interconnection device to provide additional room for the placement of signal traces beyond the space available with an electrical interconnection device that does not have via groups similar to those described.

Figure 4A:
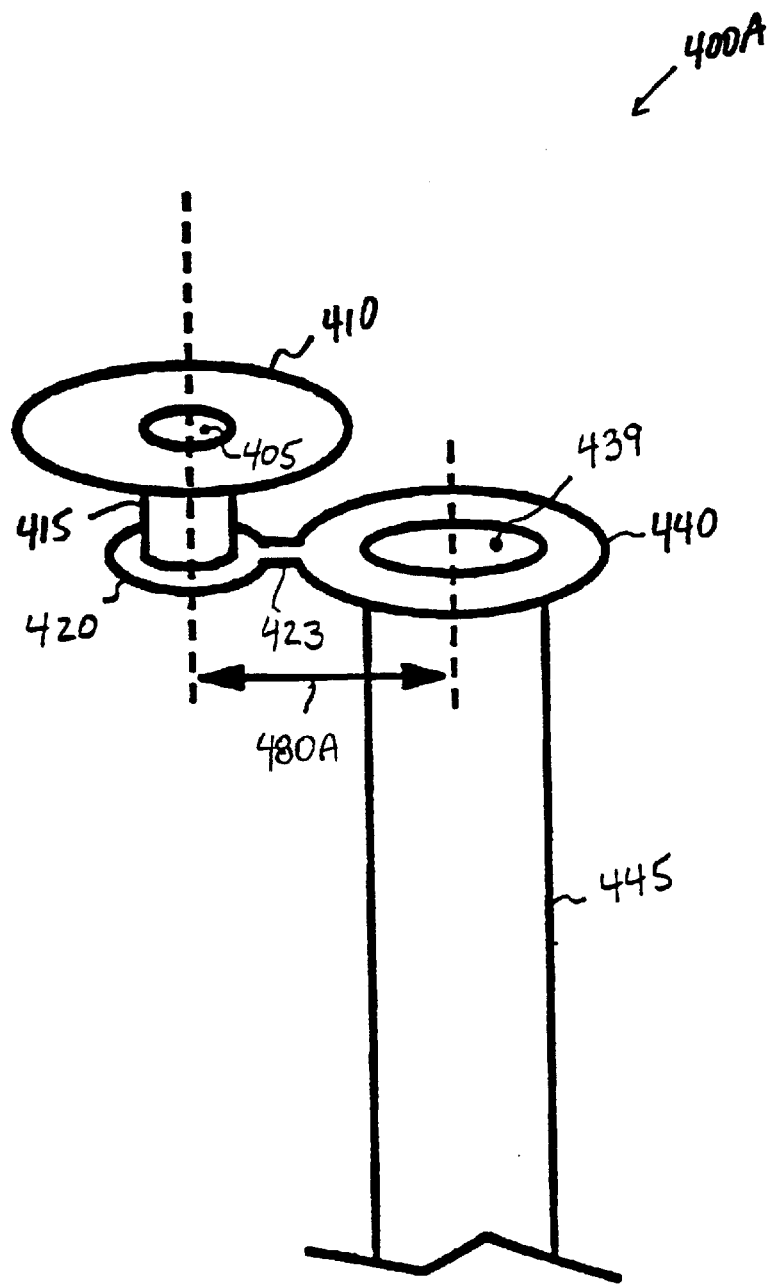
FIGS. 4A, 4B, 4C, and 4D are front, top views of embodiments of staircase via groups linking a surface pad to a core via.
Figure 4B:
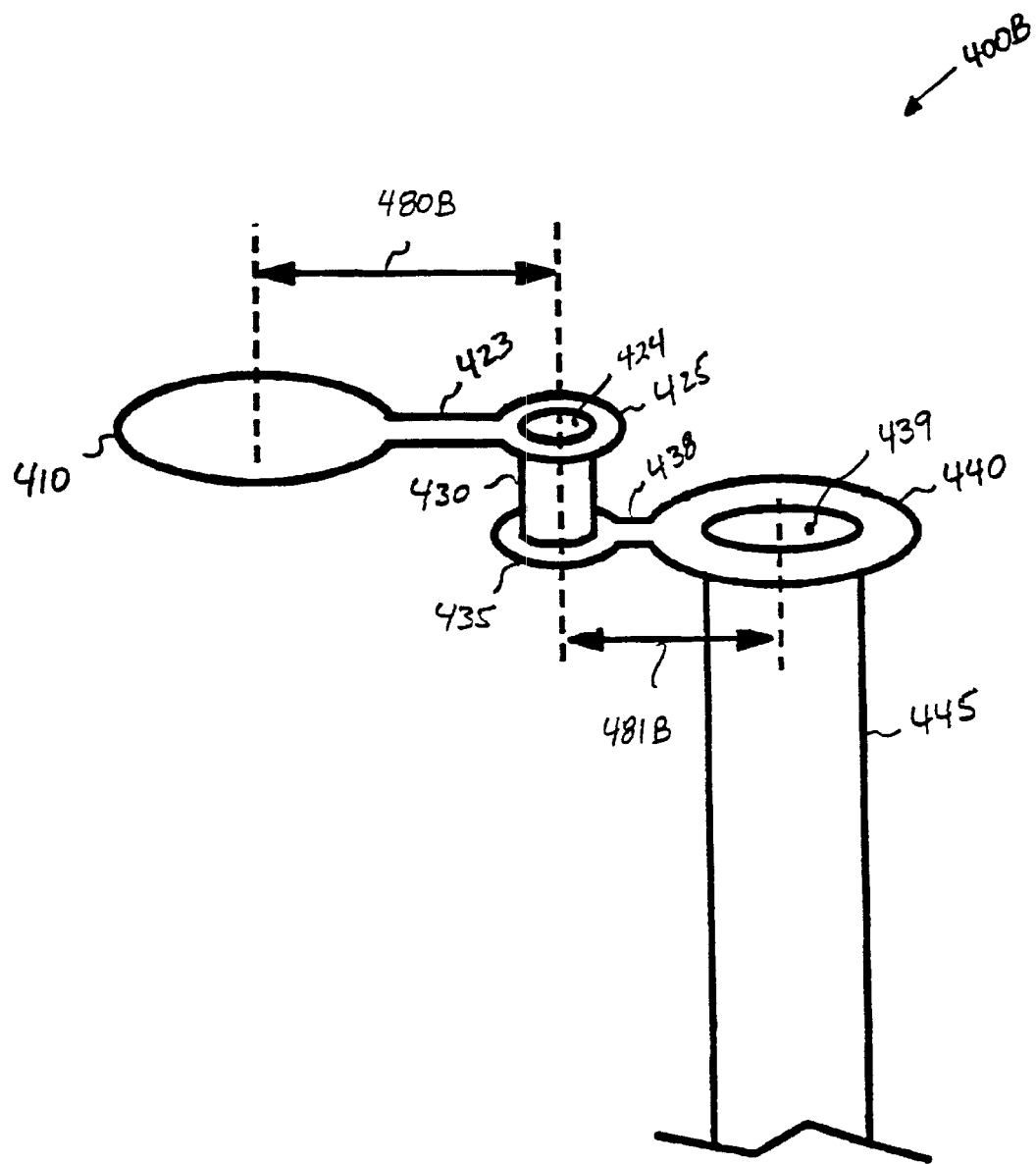
Figure 4C:
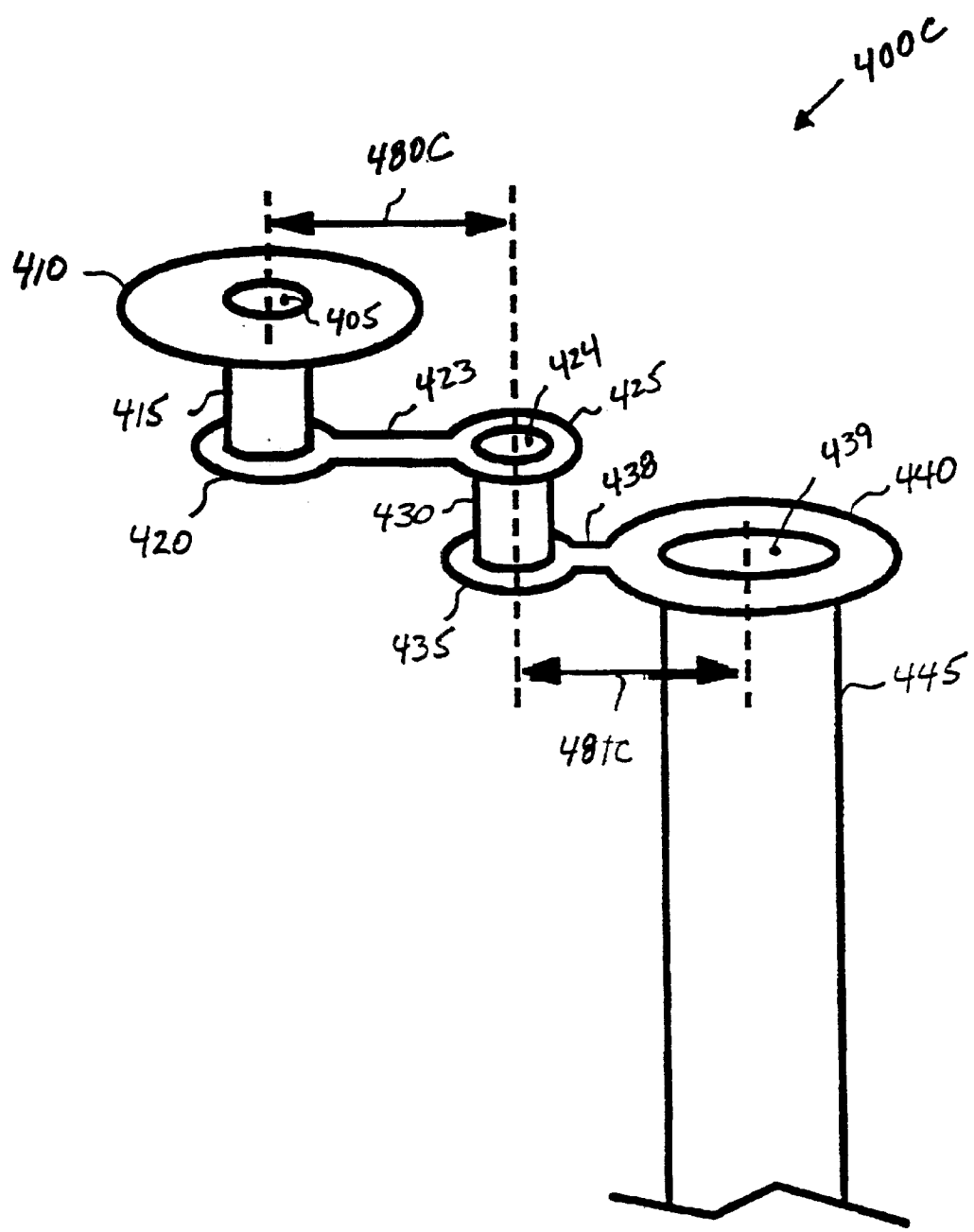
Figure 4D:
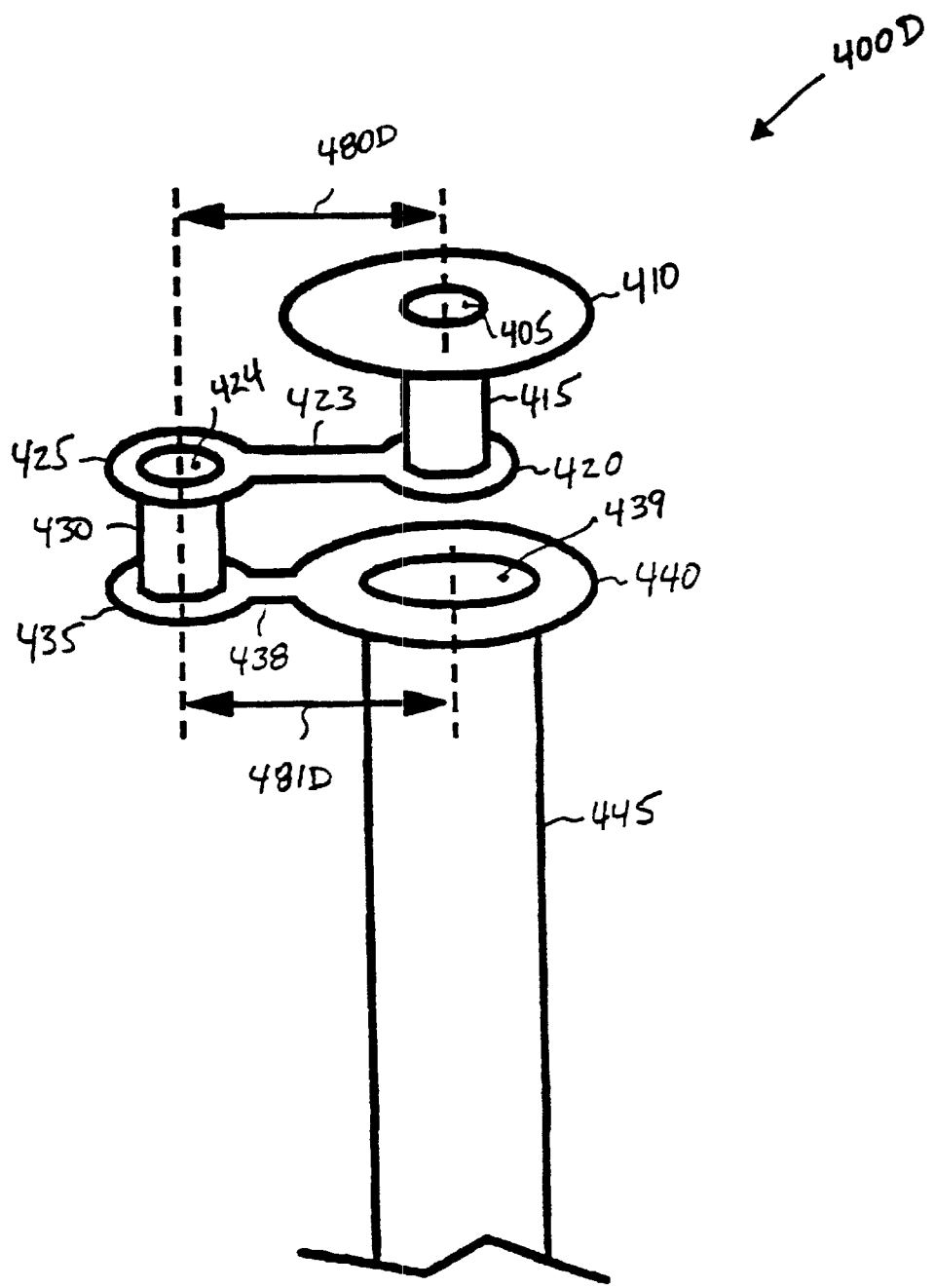

It is noted that FIGS. 4A, 4C, and 4D show the via in pad extending from a central location from the surface pad. In other embodiments, the via may extend from a location offset from the center of the pad. In general, a "blind via" is a via that extends from a first layer, usually a surface layer, to only a limited number of internal layers. A "buried via" is a via that extends from one internal layer to another internal layer. A "core via" is a via that extends through a central portion of an electrical interconnection device and may extend from surface to surface. A "microvia" is a small via, usually created by a method other than mechanical drilling.

Turning to FIG. 4A, a top, front view of an embodiment of a via group 400A is shown linking a surface pad 410 to a core via 445. As shown, a ball grid array (BGA) surface pad 410 is intersected by a via 415 (also known as "via in pad"), which is preferably a microvia 415. Microvia 415 includes an internal hole 405, as is well known in the art, and a pad 420 at the bottom of the microvia 415. The core via 445 includes a pad 440, which is connected to the pad 420 of the microvia 415 by a trace 423. Core via 445 also includes an internal hole 439, which is normally formed by mechanical drilling. Via 445 and microvia 415 are separated on the centerline by a distance 480A. In one implementation of via group 400A, microvia 415 is a blind microvia, extending from a surface to the first internal layer, while via 445 is a drilled core via extending from the first internal layer to the last internal layer.

In FIG. 4B, another embodiment of a via group 400B is shown. A BGA surface pad 410 is separated by a distance 480B from a first via 430, which is preferably a microvia 435. Microvia 430 includes an internal hole 424, and pads 425 and 435 at the top and bottom of the microvia 430, respectively. Pad 410 is connected to pad 425 by a short trace 423. Another short trace 438 connects microvia 430 with a core via 445. Core via 445 includes a pad 440 and an internal hole 439. Via 445 and microvia 430 are separated on the centerline by a distance 481B.

In FIG. 4C, still another embodiment of a via group 400C is shown. A BGA surface pad 410 is intersected by a via 415, which is preferably a microvia 415. Microvia 415 includes an internal hole 405 and a pad 420 at the bottom of the microvia 415. Microvia 415 is connected by a short trace 423 to a second via 430, which is also preferably a microvia 430 and which is separated from the microvia 415 by a centerline distance 480C. As shown, microvia 430 is a hidden via, a via that does not extend to a surface of the electrical interconnection device. Microvia 430 includes an internal hole 424, and pads 425 and 435 at the top and bottom of the microvia 430, respectively. Another short trace 438 connects microvia 430 with a core via 445. Core via 445 includes a pad 440 and an internal hole 439. Via 445 and microvia 430 are separated on the centerline by a distance 481C.

In FIG. 4D, another embodiment of a via group 400D is shown. A BGA surface pad 410 is intersected by a via 415, which is preferably a microvia 415. Microvia 415 includes an internal hole 405 and a pad 420 at the bottom of the microvia 415. Microvia 415 is connected by a short trace 423 to a second via 430, which is also preferably a microvia 430 and which is separated from the microvia 415 by a centerline distance 480D. As shown, microvia 430 is a hidden via, a via that does not extend to a surface of the electrical interconnection device. Microvia 430 includes an internal hole 424, and pads 425 and 435 at the top and bottom of the microvia 430, respectively. Another short trace 438 connects microvia 430 with a core via 445. Core via 445 includes a pad 440 and an internal hole 439. Via 445 and microvia 430 are separated on the centerline by a distance 481D.

It is noted that the angle between trace 423 and trace 438 is contemplated as being other than the 180 degrees illustrated in FIG. 4C or the 0 degrees illustrated in FIG. 4D. In one anticipated use related to FIG. 4, solder used to secure an integrated circuit or other device to the BGA pad 410 often leaks into BGA pad via hole 415. In the embodiments shown, the solder may fill the hole 415 to the surface, advantageously resulting in a solder joint with improved mechanical stability. No solder should leak into via holes 425 and 445, as these via holes are internal to the electrical interconnection device. This limits the amount of solder lost while the computer chip is mounted.

It is noted that these embodiments 400A–400D are anticipated for use where the array of surface pads does not line up well with the locations of the core vias 445. Although BGA pads are shown, other types of pads or surface connection areas or connectors are contemplated. Other geometries of surface connection areas other than those shown are also contemplated.

In a preferred implementation, the via groups 400A–400D is symmetrical with respect to the top and bottom layers of the electrical interconnection device. For example, via 415 is a part of the top and bottom layers of the electrical interconnection device. Microvia 430 is a part of the second and next-to-bottom layers, while via 445 penetrates all other layers of the electrical interconnection device. Referring to the other figures may identify further aspects of FIG. 4.

FIGS. 5A–5F—Layers of a Printed Wiring Board

FIGS. 5A–5E illustrate top views of an embodiment of an electrical interconnection device. In particular, multiple layers of a portion of a printed wiring board are shown where the layers differ in the numbers of locations of vias and connections. FIG. 5F is a cut-away, side view cutting through the middle of the layers shown in FIGS. 5A, 5B, 5D, and 5E.

Figure 5A:
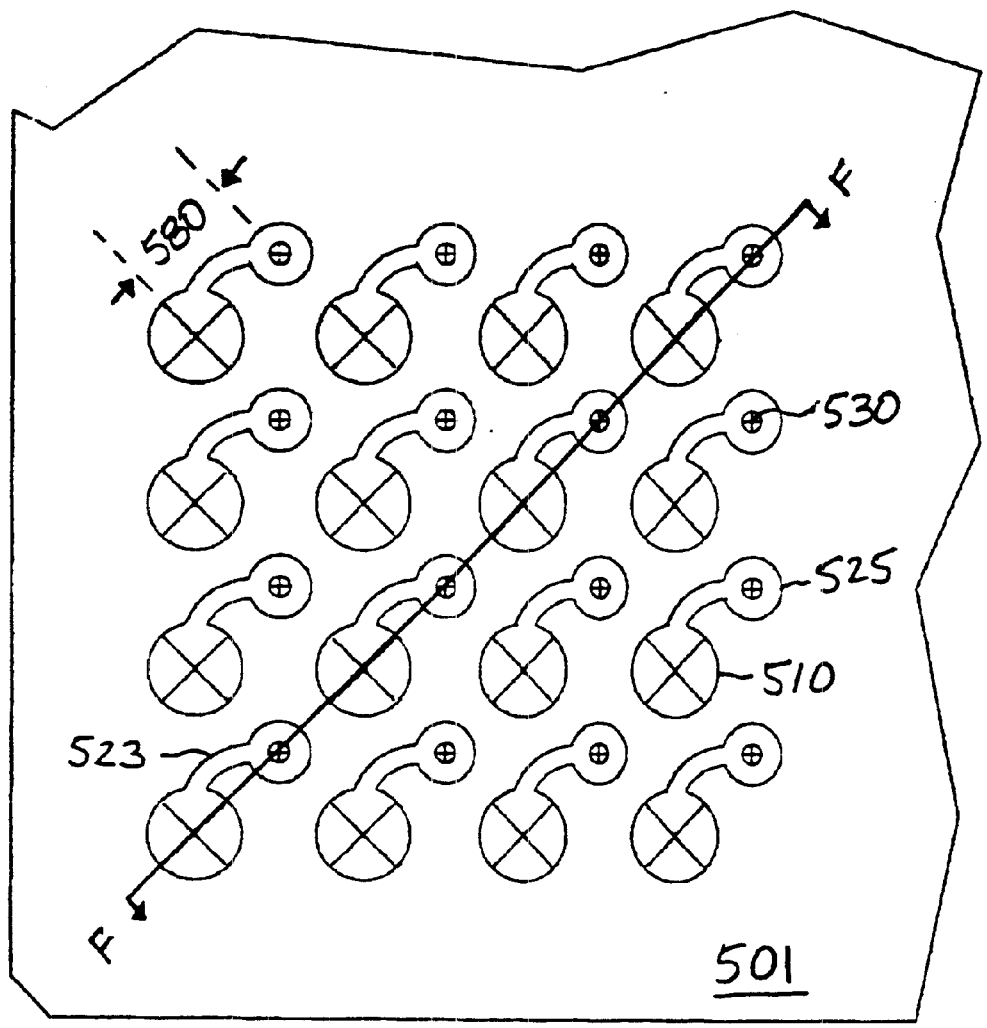
FIGS. 5A, 5B, 5C, 5D, and 5E illustrate top views of embodiments of various layers of a portion of an electrical interconnection device, where the layers differ in the numbers and locations of pads, vias, connections, and signal traces.

In FIG. 5A, a plurality of surface pads 510 is shown on surface layer 501. The surface pads 510 are arranged in a square array, with each pad 510 connected through a trace 523 to a top pad 525 associated with a via 530. The centerline distance between the pad 510 and the via 530 is 580. It is noted that the plurality of vias 530 is shown in an arrayed fashion. The view given in FIG. 5F is also shown.

Figure 5B:
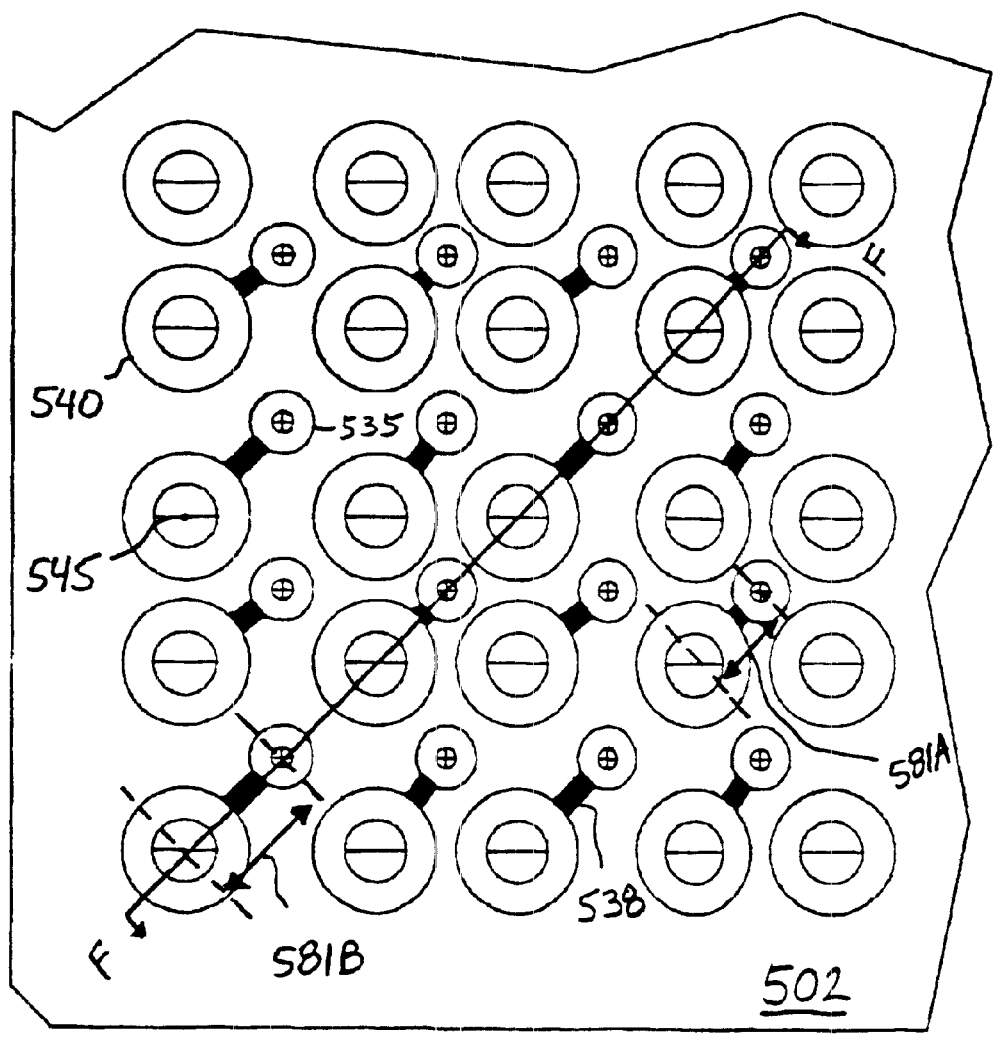

In FIG. 5B, the bottom pads 525 of the vias 530 are shown connected to the pads 540 of the vias 545 through traces 538 of varying length on layer 502. These varying lengths of the traces 538 lead to centerline separation distances between pairs of via 530 and via 545 ranging form a minimal distance 581A to a maximum distance 581B. It is noted that the vias 545 as shown are core vias 545.

Figure 5C:
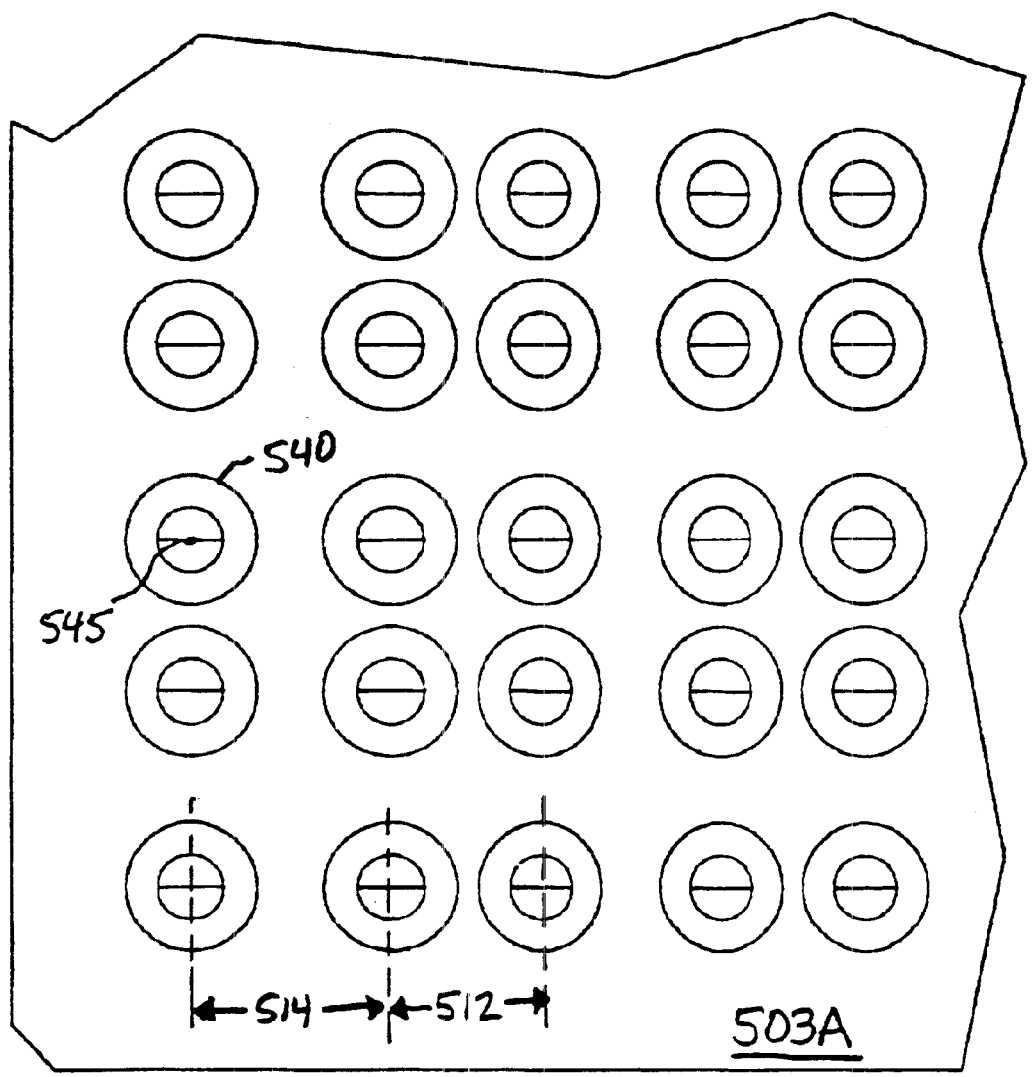

In FIG. 5C, the positions of the core vias 545 are illustrated to point out how the arrangement of the core vias 545 differs from the array of the surface pads 510, shown in FIG. 5A. The alternating pattern of rows and columns of layer 503A is similar to that shown in FIGS. 3A and 3B. The centerline separation distance between the closer groups of vias is 545, while the centerline separation distance between the more distal groups of vias 545 is 514.

Figure 5D:
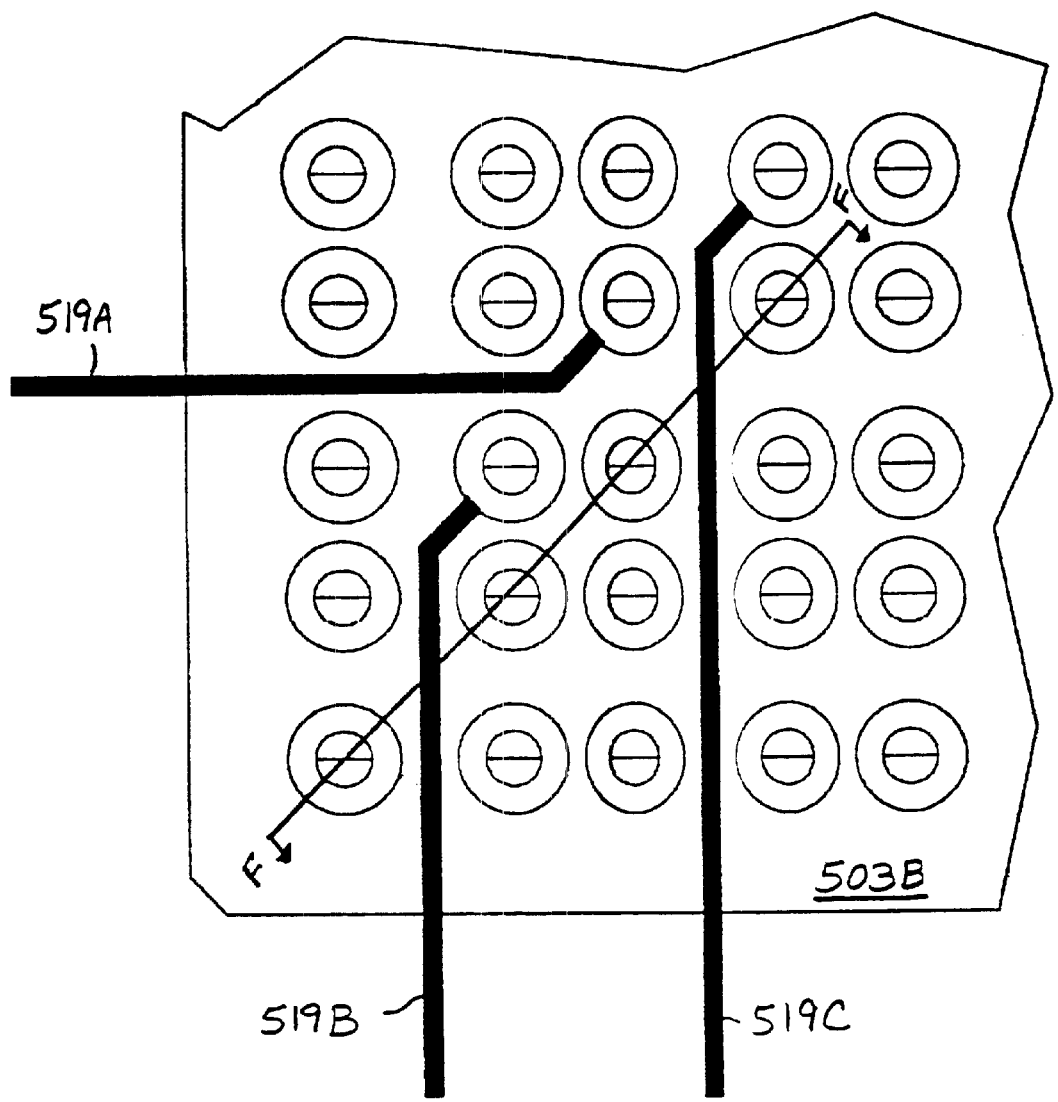
Figure 5E:
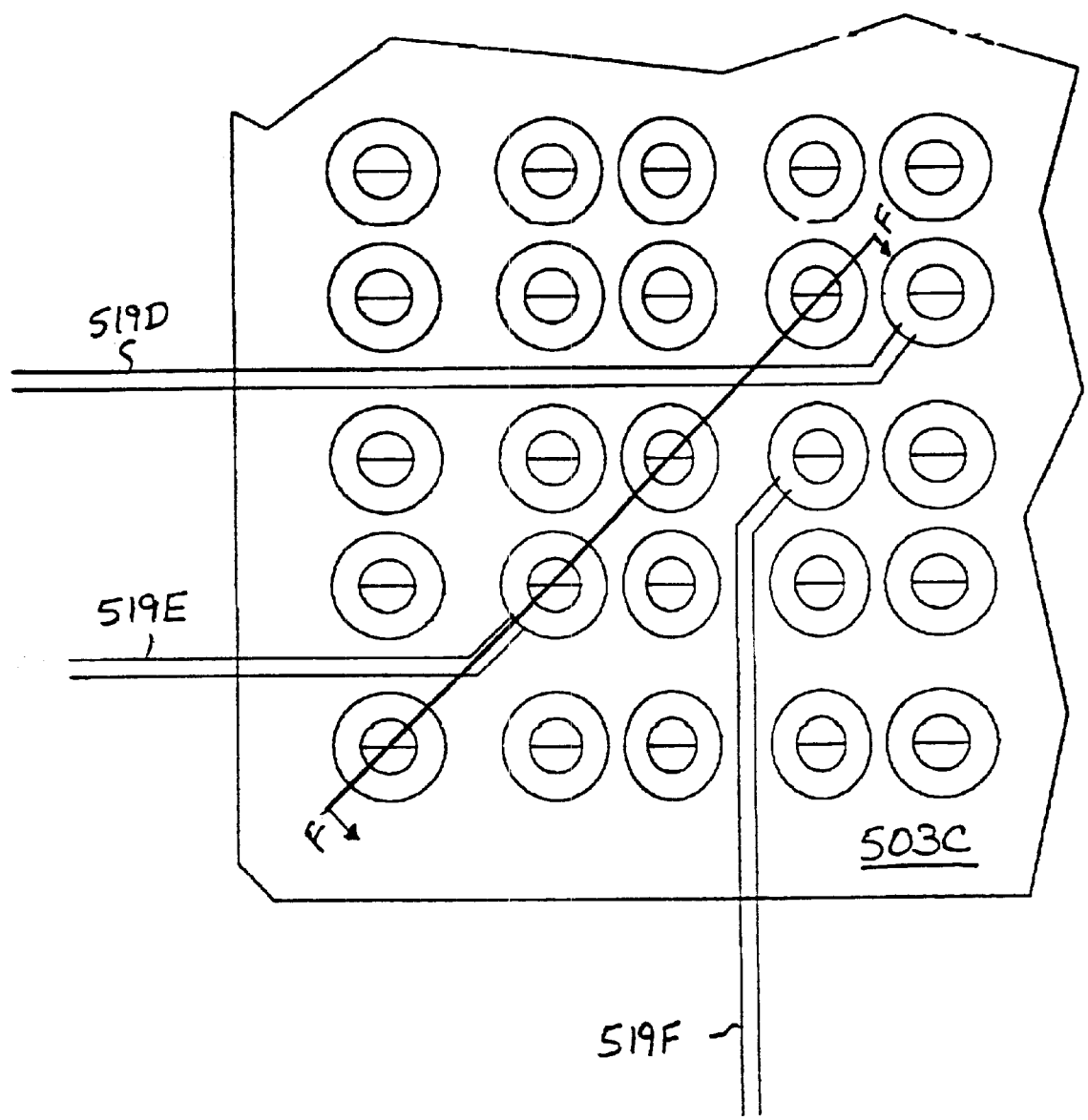
Figure 5F:
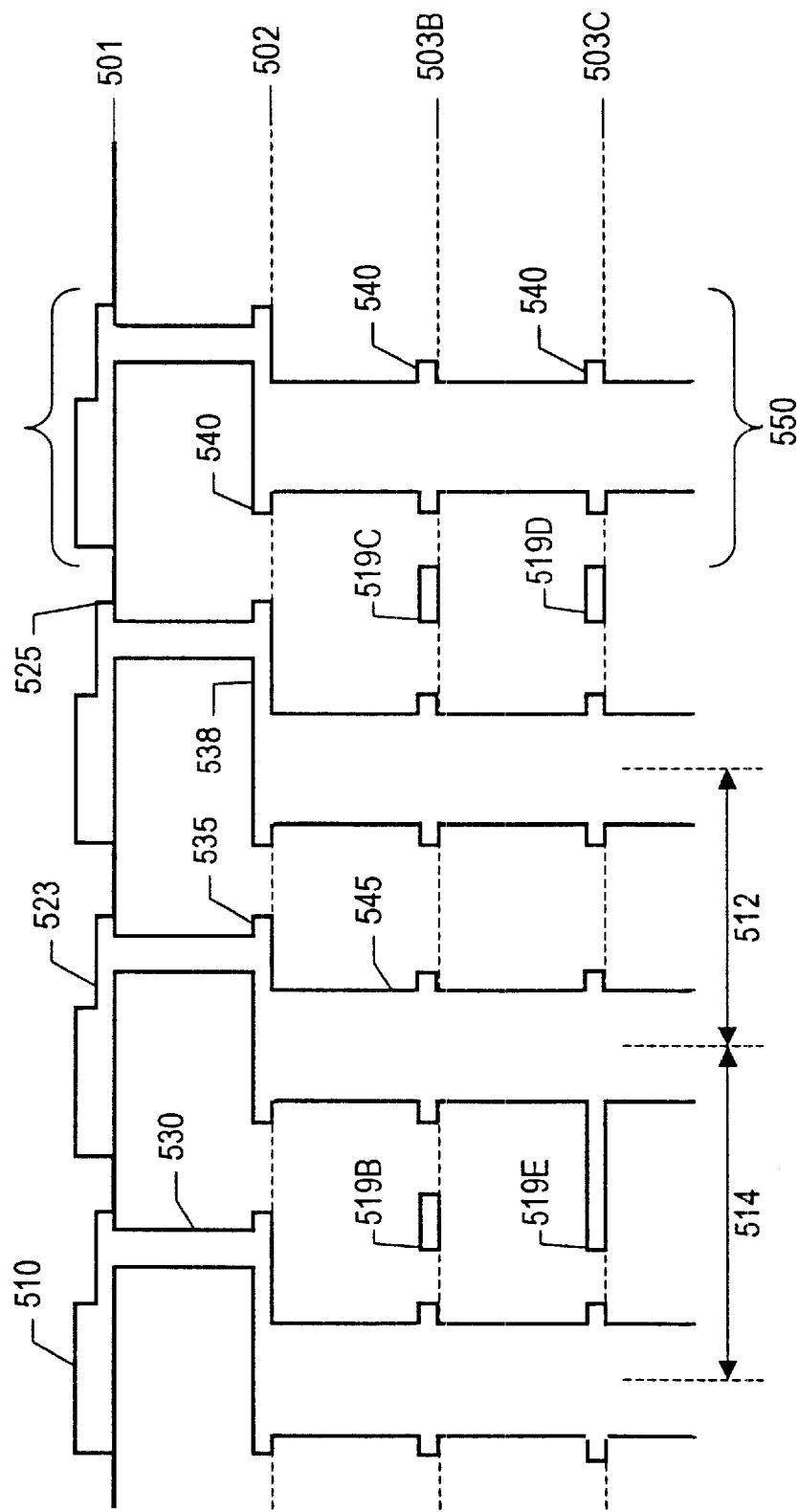
FIG. 5F illustrates a cut-away, side view of the electrical interconnection device of FIGS. 5A–5E.

In FIGS. 5D and 5E, locations of representative signal traces 519A–519F are shown with respect to the vias 545. On layer 503B, signal trace 519A extends from a first via pad 540 and runs horizontal. Signal traces 519B and 519C each extend from a respective via pad 540 and run vertically away from the respective via pad 540. On layer 503C, signal traces 519D and 519E each extend from a respective via pad 540 and run horizontally. Signal traces 519F extend from a via pad 540 and runs horizontally away from the via pad 540. It is noted that the signal traces 519 shown in FIGS. 5D and 5E are "half tracked", that is, there is space for one signal trace between the more widely spaced rows and columns (distance 514) and no space for signal traces between the more narrowly spaced rows and columns (distance 512).

FIG. 5F illustrates the cut-away, side view of the layers 501, 502, 503B, and 503C. Surface pads 510 are connected through traces 523 to via pads 525 of vias 530. Via pads 535 of vias 530 connect through traces 538 to via pads 540 of core vias 545 on the uppermost layer of core vias 545. Via pads 540 are identified on layers 503B and 503C. The locations where signal traces 519B, 519C, 519D, and 519E intersect the view of FIG. 5F are shown, as is the separation distances 512 and 514. From the side, via groups 550 are seen to each be similar to via group 400D of FIG. 4D.

Numerous variations and modifications will become apparent to those skilled in the art once the above disclosure is fully appreciated. It is intended that the following claims be interpreted to embrace all such variations and modifications.

What is claimed is:

1. A printed wiring board upon which a semiconductor package is to be mounted, the printed wiring board comprising:
   a plurality of pads formed on a surface of the printed wiring board for providing electrical connections to the semiconductor package; and
   a plurality of vias each extending from a corresponding pad to another layer of the printed wiring board, wherein each of the plurality of vias is offset from a central location of its corresponding pad, and wherein each of the plurality of pads is substantially square.

2. The printed wiring board of claim 1, wherein the central location of the corresponding pad is the center of each substantially square pad.

3. The printed wiring board of claim 1, wherein the plurality of pads are each adapted to be solder bonded to a respective corresponding pad on the semiconductor package.

4. The printed wiring board of claim 1, wherein the semiconductor package includes an array of evenly spaced connectors, and wherein the plurality of pads are symmetrically arranged such that each pad aligns with a corresponding connector on the semiconductor package when the semiconductor package is mounted on the printed wiring board.

5. The printed wiring board of claim 1, further comprising:
   a plurality of layers including an internal layer, wherein the plurality of vias extend from the surface to the internal layer;
   wherein the plurality of vias includes at least three consecutive rows of vias, wherein a spacing between a first row of the three consecutive rows of vias and a second row of the three consecutive rows of vias is greater than the spacing between the second row and a third row of the three consecutive rows of vias.

6. The printed wiring board of claim 5, further comprising:
   a first set of signal traces located between the first and second rows of the three consecutive rows of vias; and
   a second set of signal traces located between the second and third rows of the three consecutive rows of vias, wherein a number of signal traces in the first set of signal traces and the number of signal traces in the second set of signal traces differs by a non-zero integer, and wherein the signal traces of the first and second sets of signals traces are substantially uniform in width.

7. The printed wiring board of claim 1, further comprising:
   a plurality of layers including a first internal layer and a second internal layer; and
   wherein the plurality of vias includes a first via and a second via, wherein the first via extends to the first internal layer and the second via extends to the second internal layer, wherein the first via is physically and electrically connected to a first signal trace on the first internal layer, and the second via is physically and electrically connected to a second signal trace on the second internal layer.

8. The printed wiring board of claim 1, wherein the plurality of vias are grouped into a plurality of via groups, and wherein each of the plurality of via groups includes a plurality of electrically interconnected non-collinear vias.

9. A printed wiring board upon which a semiconductor package is to be mounted, the printed wiring board comprising:
   a plurality of pads formed on a surface of the printed wiring board for providing electrical connections to the semiconductor package;
   a plurality of vias each extending from a corresponding pad to another layer of the printed wiring board, wherein each of the plurality of vias is offset from a central location of its corresponding pad; and
   a plurality of layers including an internal layer, wherein the plurality of vias extend from the surface to the internal layer;
   wherein the plurality of vias includes at least three consecutive rows of vias, wherein a spacing between a first row of the three consecutive rows of vias and a second row of the three consecutive rows of vias is greater than the spacing between the second row and a third row of the three consecutive rows of vias.

10. The printed wiring board of claim 9, further comprising:
    a first set of signal traces located between the first and second rows of the three consecutive rows of vias; and
    a second set of signal traces located between the second and third rows of the three consecutive rows of vias, wherein a number of signal traces in the first set of signal traces and the number of signal traces in the second set of signal traces differs by a non-zero integer, and wherein the signal traces of the first and second sets of signals traces are substantially uniform in width.

11. The printed wiring board of claim 9, wherein the plurality of pads are each adapted to be solder bonded to a respective corresponding pad on the semiconductor package.

12. The printed wiring board of claim 9, wherein the semiconductor package includes an array of evenly spaced connectors, and wherein the plurality of pads are symmetrically arranged such that each pad aligns with a corresponding connector on the semiconductor package when the semiconductor package is mounted on the printed wiring board.

13. The printed wiring board of claim 9, further comprising:
a plurality of layers including a first internal layer and a second internal layer; and
wherein the plurality of vias includes a first via and a second via, wherein the first via extends to the first internal layer and the second via extends to the second internal layer, wherein the first via is physically and electrically connected to a first signal trace on the first internal layer, and the second via is physically and electrically connected to a second signal trace on the second internal layer.

14. The printed wiring board of claim 9, wherein the plurality of vias are grouped into a plurality of via groups, and wherein each of the plurality of via groups includes a plurality of electrically interconnected non-collinear vias.

15. A printed wiring board upon which a semiconductor package is to be mounted, the printed wiring board comprising:
a plurality of pads formed on a surface of the printed wiring board for providing electrical connections to the semiconductor package; and
a plurality of vias each extending from a corresponding pad to another layer of the printed wiring board, wherein each of the plurality of vias is offset from a central location of its corresponding pad, wherein the plurality of vias are grouped into a plurality of via groups, and wherein each of the plurality of via groups includes a plurality of electrically interconnected non-collinear vias.

16. The printed wiring board of claim 15, wherein the plurality of pads are each adapted to be solder bonded to a respective corresponding pad on the semiconductor package.

17. The printed wiring board of claim 15, wherein the semiconductor package includes an array of evenly spaced connectors, and wherein the plurality of pads are symmetrically arranged such that each pad aligns with a corresponding connector on the semiconductor package when the semiconductor package is mounted on the printed wiring board.

18. A printed wiring board upon which a semiconductor package is to be mounted, the printed wiring board comprising:
a first via extending from a surface of the printed wiring board to a first inner layer of the printed wiring board, wherein the first via further makes an electrical connection to a pad on the surface of the printed wiring board; and
a second via electrically coupled to the first via, wherein the second via provides an electrical connection from the first inner layer of the printed wiring board to a second layer of the printed wiring board, wherein the second via is positioned such that the centers of the first via and the second via are non-collinear.

19. The printed wiring board of claim 18, wherein the second layer of the printed wiring board is a second internal layer of the printed wiring board; the printed wiring board further comprising a third via extending from the second internal layer of the printed wiring board to a third layer of the printed wiring board, wherein the second via and the third via are electrically coupled.

20. The printed wiring board of claim 19, wherein the third via is positioned such that the centers of the second via and the third via are non-collinear.

21. The printed wiring board of claim 19, wherein the third via is positioned such that the centers of the first via, second via, and the third via are all non-collinear.

22. The printed wiring board of claim 18, wherein the first via extends from a central location in the pad on the surface of the printed wiring board.

23. The printed wiring board of claim 18, wherein the first via extends from a location in the pad on the surface of the printed wiring board which is offset from the center of the pad.

24. A printed wiring board upon which a semiconductor package is to be mounted, the printed wiring board comprising:
a uniformly spaced set of pads on a surface of the printed wiring board;
a first set of vias extending from the uniformly spaced set of pads on the surface of the printed wiring board and making an electrical connection from the surface of the printed wiring board to a first inner layer of the printed wiring board;
a second set of vias extending from the first inner layer of the printed wiring board to a second layer of the printed wiring board, wherein at least one via of the second set of vias is positioned offset from a corresponding via of the first set of vias, wherein at least one of the vias of the first set of vias is electrically connected to a via of the second set of vias, and wherein a spacing among the second set of vias at the second layer of the printed wiring board is non-uniform.

25. The printed wiring board of claim 24, wherein at least one via of the first set of vias extends from a central location in a respective pad of the uniformly spaced set of pads on the surface of the printed wiring board.

26. The printed wiring board of claim 24, wherein the spacing among the first set of vias at the first inner layer of the printed wiring board is uniform.

27. The printed wiring board of claim 24, wherein at least one via of the first set of vias extends from a location in a respective pad of the uniformly spaced set of pads on the surface of the printed wiring board which is offset from the center of the pad, whereby the spacing among the first set of vias at the first inner layer of the printed wiring board is non-uniform.

28. The printed wiring board of claim 24, wherein the spacing among the first set of vias at the first inner layer of the printed wiring board is non-uniform.

29. A printed wiring board upon which a semiconductor package is to be mounted, the printed wiring board comprising:
a plurality of via groups;
a plurality of layers interconnected by the plurality of via groups, wherein each of the plurality of via groups includes a plurality of electrically interconnected non-collinear vias; and
a plurality of pads formed on a surface layer of the plurality of layers, wherein a respective one of the plurality of via groups extend to another layer of the printed wiring board from each of the plurality of pads, wherein each via group extends from a central location of its corresponding pad, wherein the plurality of via groups includes a first via group, wherein the first via group includes:
- a blind via electrically connecting a pad located on a surface of the printed wiring board to fewer than all layers of the printed wiring board and ending on a first internal layer of the printed wiring board;
- a hidden via electrically connecting the blind via to an additional internal layer of the printed wiring board, wherein the blind via and the hidden via are physically connected through a conducting trace on the first internal layer of the printed wiring board, wherein the centers of the blind via and the hidden via are non-collinear; and
- a core via electrically coupled to the hidden via, wherein the core via physically and electrically connects the additional internal layer to one or more internal layers of the plurality of layers without extending to any surface of the printed wiring board, wherein the core via ends on a second internal layer, wherein the hidden via and the core via are physically connected through a conducting trace on the additional internal layer, and wherein the centers of the hidden via and the core via are non-collinear.

30. The printed wiring board of claim 29, wherein the centers of the blind via and the core via are non-collinear.

31. The printed wiring board of claim 29, wherein the centers of the blind via and the core via are collinear.

\* \* \* \* \*